(12) United States Patent
Jain et al.

(10) Patent No.: US 7,170,669 B1
(45) Date of Patent: Jan. 30, 2007

(54) SPATIAL LIGHT MODULATOR ARRAY WITH HEAT MINIMIZATION AND IMAGE ENHANCEMENT FEATURES

(75) Inventors: Kanti Jain, Briarcliff Manor, NY (US); William C. Sweatt, Albuquerque, NM (US); Marc Zemel, New Rochelle, NY (US)

(73) Assignees: Anvik Corporation, Hawthorne, NY (US); Sandia Corporation, Albuquerque, NM (US)

( * ) Notice: Subject to any disclaimer, the term of this patent is extended or adjusted under 35 U.S.C. 154(b) by 0 days.

(21) Appl. No.: 11/237,382

(22) Filed: Sep. 28, 2005

(51) Int. Cl.
*G02B 26/00* (2006.01)
(52) U.S. Cl. ........................ 359/291; 359/290; 359/223
(58) Field of Classification Search ................ 359/290, 359/291, 223, 224, 295
See application file for complete search history.

(56) References Cited

U.S. PATENT DOCUMENTS 5,311,360 A * 5/1994 Bloom et al. ............... 359/572
6,317,947 B1 * 11/2001 Ruschmann ................ 29/17.2
2003/0007226 A1 * 1/2003 Buzzetta .................... 359/225
2004/0008406 A1 * 1/2004 Blitstein .................... 359/361
2006/0050356 A1 * 3/2006 Varaprasad et al. ......... 359/265
2006/0109576 A1 * 5/2006 Baba-Ali .................... 359/879

* cited by examiner

*Primary Examiner*—Timothy Thompson
*Assistant Examiner*—Jerry Fang
(74) *Attorney, Agent, or Firm*—Carl Kling; Kevin W. Bieg (57) ABSTRACT

An enhanced spatial light modulator (ESLM) array, a microelectronics patterning system and a projection display system using such an ESLM for heat-minimization and resolution enhancement during imaging, and the method for fabricating such an ESLM array. The ESLM array includes, in each individual pixel element, a small pixel mirror (reflective region) and a much larger pixel surround. Each pixel surround includes diffraction-grating regions and resolution-enhancement regions. During imaging, a selected pixel mirror reflects a selected-pixel beamlet into the capture angle of a projection lens, while the diffraction grating of the pixel surround redirects heat-producing unused radiation away from the projection lens. The resolution-enhancement regions of selected pixels provide phase shifts that increase effective modulation-transfer function in imaging. All of the non-selected pixel surrounds redirect all radiation energy away from the projection lens. All elements of the ESLM are fabricated by deposition, patterning, etching and other microelectronic process technologies.

21 Claims, 10 Drawing Sheets

SPATIAL LIGHT MODULATOR ARRAY WITH HEAT MINIMIZATION AND IMAGE ENHANCEMENT FEATURES

BACKGROUND OF THE INVENTION (1) Field of the Invention

This invention relates to a heat-minimizing spatial light modulator with image enhancement features based on diffracting digital micromirror devices (DDMDs) and to techniques for fabricating and incorporating DDMDs in projection optical imaging and patterning systems.

(2) Description of Related Art

A maskless lithography technology that is capable of high-resolution patterning is essential for manufacturing of many microelectronic and bio-molecular devices. Lithographic techniques using conventional masks involve a multi-step process which includes defining the desired features on the mask which is then used to transfer the features onto a substrate by imaging. The process of fabricating a high-density electronic circuit involves the imaging of numerous layers (often more than 20) and requires a different mask for each layer. As the minimum feature sizes of semiconductor devices continue to shrink, the cost of masks for integrated circuit fabrication continues to increase, now exceeding a million dollars for a mask set for the leading devices.

Further, when building a prototype electronic module, the mask for each layer needs to be designed and fabricated many times in order to optimize the design of the prototype device. This leads to extremely long development times for prototyping any kind of electronic circuit. Additionally, in numerous defense applications, the number of different application-specific modules required is large, whereas the quantities needed of each type of module are not large. Since it is not possible in such a production scenario to amortize the high mask costs over large volumes, the mask costs become especially unbearable.

Thus, a maskless lithography technology that provides the required high resolution and desired patterning throughput will eliminate the need for expensive masks and remove a significant barrier to the cost-effective manufacturing of numerous electronic products. Finally, the vast majority of biotechnology applications that require rapid structuring of bio-surfaces, such as nano-texturing of bone implant surfaces, proteomics, and micro-array generation, will also be greatly enhanced if the desired patterning could be accomplished with high-resolution maskless lithography.

Spatial light modulators based on digital micromirror devices (DMDs) are used in a variety of projection optical imaging and maskless patterning applications. Such DMDs have been described with a variety of pixel elements, including tiltable, displaceable and modulatable pixel elements. Many of these DMDs can be produced in volume using semiconductor-like fabrication methods and equipment.

Special techniques of enhancing the resolution capability of DMDs, by fabricating small-area pixel mirrors, have also been described. Such techniques involve limiting the size of the reflective pixel mirror to only a small portion, such as one-eighth, of the area of the pixel element. This can result in a different problem, however, since the self-protective nature of the typical fully-mirrorized pixel element is diminished greatly—namely, heating of the spatial light modulator array by the non-reflected majority (⅞ths) of the incident radiation. Note that the typical projection light source is routinely used with suitable filters to eliminate virtually all heating by any undesired frequencies of the light source output. The desired frequencies (visible light in projection display systems, and ultra-violet radiation in patterning systems) are not usually considered dangerous sources of heat-causing energy, when used properly, i.e., without excessive absorption in any component of the system in which they are used. These desired frequencies, however, when present at power levels typical to patterning systems and projection display systems, are significant sources of heat when absorbed by the majority non-reflective areas of a spatial light modulator in which the reflective area is only a small portion of the total pixel element area. The repetitive nature of the typical patterning system, and the constant nature of the typical display system, can cause such systems to suffer damage by destructive heat buildup, e.g., degradation of the DMD, its driver electronics, optical components, and their coatings.

BRIEF SUMMARY OF THE INVENTION

This invention provides a heat-rejecting capability to each pixel element of a DMD-type spatial light modulator, significantly diminishing undesirable heat build-up in the spatial light modulator array module, in the optical components of the projection module, and at the projection image device, typically the substrate where the system is put to practical use as image for viewing or as pattern optical machining.

An object of this invention is to enable very-large-scale systems of spatial light modulators and targets to operate without destructive heating effects.

Another object of this invention is to provide enhancement of the resolution in the projected image beyond that which could be achieved using simple mirror pixels in the DMD-type spatial light modulator.

A feature of the invention is the use of diffracting digital micromirror devices (DDMD) that incorporate reflective phase grating features and reflective mirror features as pixel elements in the spatial light modulator.

Another feature of the invention is the use of additional resolution enhancing features in the diffracting digital micromirror devices (DDMD).

An advantage of the invention is that the illumination radiation, incident on the non-mirror portion of the spatial light modulator DDMD pixel surface, is redirected by the reflective phase grating so that none of the incident power is absorbed in that area of the pixel element, eliminating a source of deleterious heating of the spatial light modulator.

Another advantage of the invention is that the illumination radiation incident on the non-mirror portion of the spatial light modulator DDMD pixel surface is redirected by the reflective phase grating so that none of the power in the redirected beam or beams is incident on the projection lens, eliminating a source of heating that causes image distortion or damage to the optics.

Another advantage of the invention is that the illumination radiation, incident on the non-mirror portion of the spatial light modulator DDMD pixel surface, is redirected by the reflective phase grating so that none of the power in the redirected beam or beams is incident on the substrate, eliminating a source of deleterious heating that causes substrate distortion or damage and eliminating a source of deleterious exposure of the substrate.

Another advantage of the invention is that the illumination radiation that is incident on the pixel mirror and image enhancing feature portions of the spatial light modulator DDMD pixel surface is directed through the projection lens to form an image with higher resolution than could be achieved with the simple mirror pixels of the prior art.

Other objects, features, and advantages of the invention will be apparent from the following written description, claims, abstract, and the annexed drawings.

DETAILED DESCRIPTION OF THE INVENTION

General Considerations

Spatial light modulator (SLM) arrays are used in maskless lithography and other applications. A variety of SLMs have been employed for use with different wavelengths. The most widely investigated type of SLM comprises a 2-D array of micromirrors fabricated in Si wafers with process technologies similar to those used in IC production. In these SLMs, typically the size of an individual micromirror element (pixel) is approximately 15×15 μm. When used in lithography, the achievable system resolution and throughput depend on the pixel size and number of pixels. It is highly desirable to make the size of each pixel as small as possible and the number of pixels in an SLM array as large as possible. For example, with advanced microelectromechanical systems (MEMS) technologies, it is possible to make an SLM array with a grid size of 4×8 μm, with a total number of micromirrors as large as $10^8$–$10^9$.

By minimizing the size of the pixels, it is possible to pack more pixels into a given area. The pixel size governs the reduction ration required to achieve a given resolution. Accordingly, by reducing the pixel size, the required reduction ratio and the corresponding demands on the projection lens design can be minimized. Due to the constraints of current MEMS and CMOS fabrication capabilities, it is difficult to reduce the pixel size to arbitrarily small dimensions (1×1 μm or smaller), which would further reduce the required reduction ratio, while maintaining the required performance and minimizing the number of nonfunctioning pixels.

However, it is possible to achieve high resolution using large pixel elements (4×8 μm or larger) that are manufacturable by limiting the size of the specularly reflective region (the mirror region) to a small portion (2×2 μm or smaller) of the 4×8 μm pixel element surface. This makes the achievable feature resolution in lithography finer and reduces the demands on the projection lens.

If the specularly reflective mirror region of the pixel surface is a small portion of the entire pixel surface, the majority of the power in the incident illumination beam falls upon the other regions of the pixel element surface. It is important that this incident power is not absorbed by the pixel element and that it be redirected away from the DMD spatial light modulator without causing any deleterious heating or optical damage. In order to avoid deleterious heating of or damage to the projection lens, it is also important that the redirected power does not impinge upon the projection lens for both angular positions of the pixel that correspond to the selected state and the non-selected state. Similarly, in order to avoid deleterious heating of the substrate or spurious exposure of the substrate, it is important that the redirected power does not impinge upon the projection lens for both angular positions of the pixel that correspond to the selected state and the non-selected state.

These conditions for redirection of the incident power can be satisfied if the non-mirror regions of the pixel surface are covered with a reflection phase grating with appropriate grating depth, grating periodicity and grating groove orientation. The grating surface is coated to be highly reflecting at the incident illumination wavelength. With proper design, the vast majority of the incident power that falls upon the grating covered regions will be redirected into the +1 and −1 diffraction orders to form beams that miss the projection lens and substrate for both selected and non-selected orientations.

A binary phase grating with quarter-wave groove depth could be used and would be advantageous due to simplicity of fabrication. However, using variable-level (gray-scale) gratings with multiple steps could provide some additional degrees of freedom for improving the printed image. The grating should be designed to seamlessly interface with the pixel mirror so that the image definition and contrast are maximized.

An important additional advantage can be obtained by surrounding the mirror region on each pixel with a resolution enhancement feature such a reflective phase shift feature that is designed to sharpen the image produced by the light reflected from it and from the mirror itself. The rest of the pixel surface would be covered by a reflection phase grating as described above. Other resolution enhancement features that could be incorporated include optical proximity correction, scattering bars, and sub-resolution assist features. It is actually easier to implement resolution enhancement techniques for this type of DMD-based maskless lithography than for conventional mask-based lithography. For DMD-based maskless lithography, the pixel mirrors are well separated from each other such that they can be considered isolated and a single optimized design for the resolution enhancement feature can be implemented for all of the pixels. In comparison, for conventional mask-based lithography, many different features and techniques must be implemented depending on the configuration of the image.

The concept of this invention works in synchrony with standard MEMS fabrication practices. It allows the DDMDs to be composed of flat plates that are carved, using lithography, into mirror surfaces, electrodes, springs, etc. The mirror substrates can be flat with the mirror and the diffractive structures comprising the reflection phase grating can be deposited on top. Alternative means of disposing of unwanted incident light would require ti FIGS. 1 and 2 show the maskless lithography system that makes use of an SLM composed of the diffracting digital micromirror devices (DDMD), simplified to showing a single pixel element addressed in two angular attitudes, respectively denoted "selected" and "non-selected." A light source 1, which is preferably a laser but could be a lamp, emits an essentially collimated beam of light 2 that is incident on the entire front surface of pixel element 3, illuminating both pixel mirror 4 and pixel mirror surround grating 5.

Figure 1:
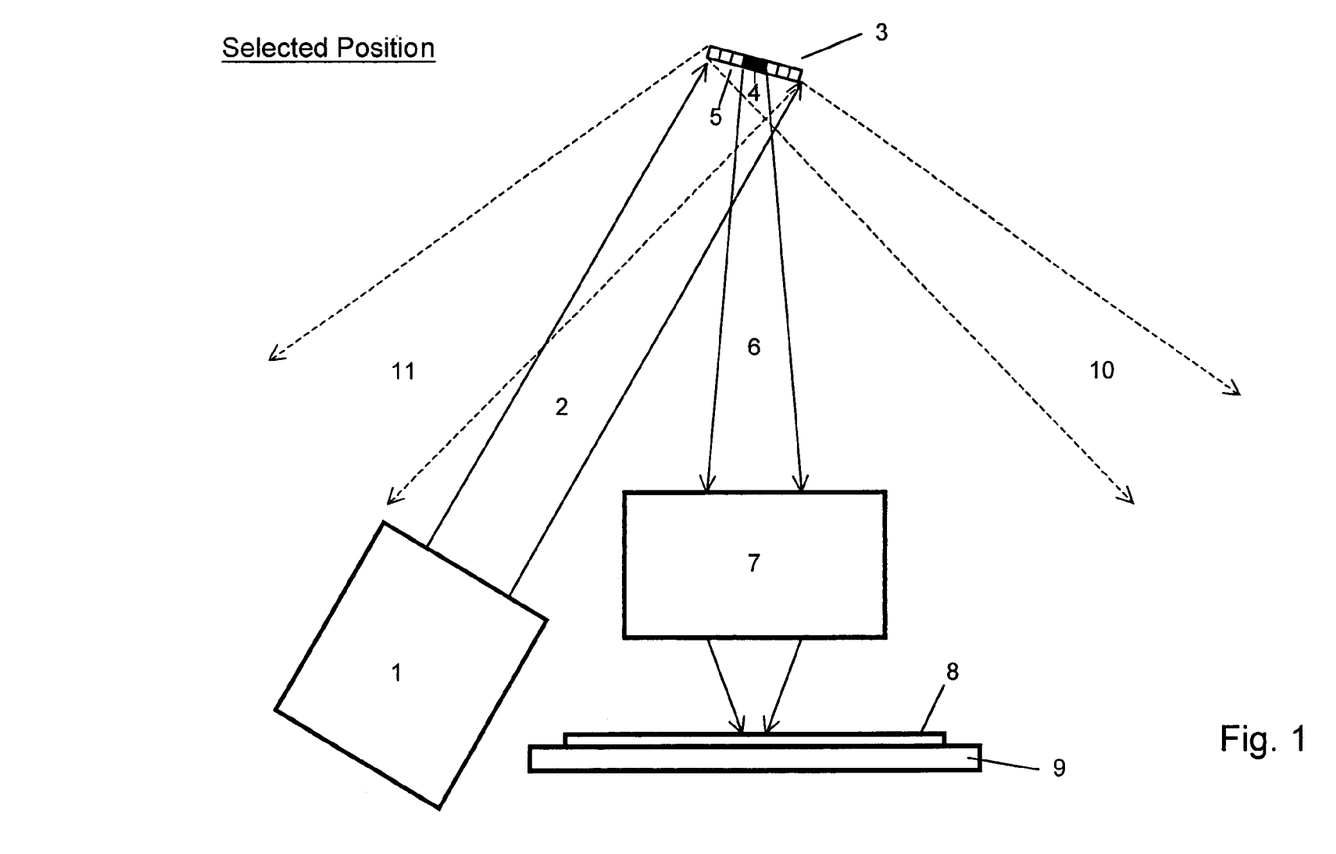
FIG. 1 and FIG. 2 show the maskless lithography system that makes use of a spatial light modulator (SLM) composed of the diffracting digital micromirror devices (DDMD), simplified to showing a single pixel with two angular positions, denoted "selected" in FIG. 1 and "non-selected" in FIG. 2.

FIG. 1 shows the selected pixel element where the angle of the selected pixel element 3 is adjusted such that the beam of light 6 reflected by the pixel mirror 4 is directed to the projection lens 7 for transmission to the substrate 8 for useful work. Substrate 8 is mounted upon stage 9. The light incident on pixel mirror surround grating 5 is diffracted into a multiplicity of orders that form beams, of which each propagates at a significant angle with respect to reflected beam 6. These diffracted beams carry away most of the illumination power that was incident on the pixel mirror surround grating 5, preventing deleterious heating of the pixel. FIG. 1 shows two of the diffracted beams, beam 10 corresponding to the +1 order and beam 11 corresponding to the −1 order. By selection of the appropriate periodicity and groove orientation for grating 5 the directions of propagation of beam 10 and beam 11 can be made such that they miss the projection lens 7 and hence do not heat the projection optics or cause deleterious exposure or heating of the substrate. In the most general case, the diffracted beams propagate at angles that are above and below the plane shown in FIG. 1, which is the same as the plane defined by the incident beam 2 and reflected beam 6.

Figure 2:
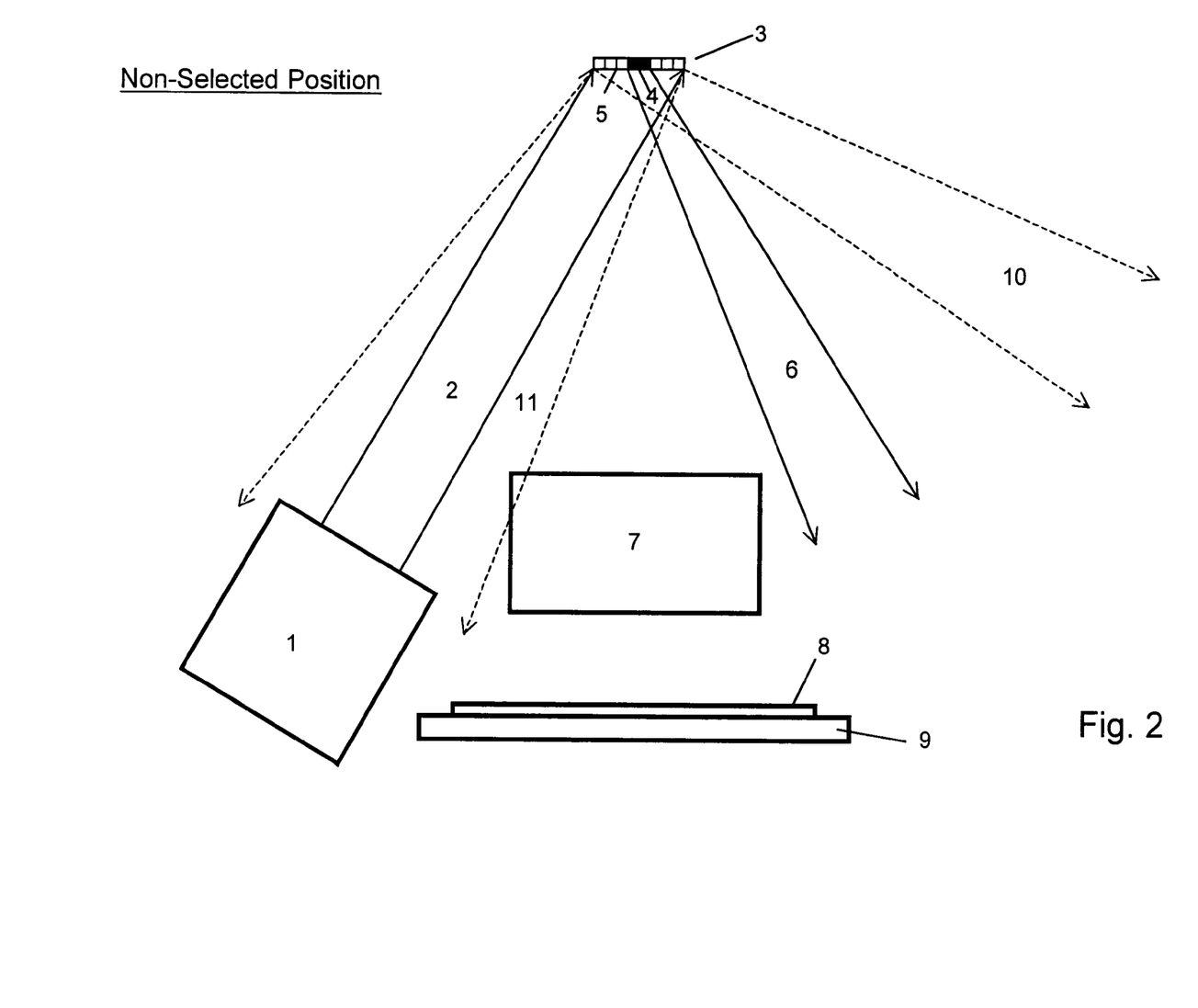

FIG. 2 shows the non-selected position of the SLM where the angle of the non-selected pixel element 3 is adjusted such that the beam of light 6 reflected by the pixel mirror 4 is directed to miss the projection lens 7 and hence is not transmitted to impinge on substrate 8 mounted on stage 9. As in the case of FIG. 1, the light incident on pixel mirror surround grating 5 is diffracted into a multiplicity of orders that form beams that each propagates at a significant angle with respect to reflected beam 6. As in the case of FIG. 1, these diffracted beams carry away most of the illumination power that was incident on the pixel mirror surround grating 5, preventing deleterious heating of the pixel. Again, as in the case of FIG. 1, by selection of the appropriate periodicity and groove orientation for grating 5 the directions of propagation of beam 10 and beam 11 can be made such that they miss the projection lens 7 and hence do not heat the projection optics or cause deleterious exposure or heating of the substrate. In the most general case, the diffracted beams propagate at angles that are above and below the plane shown in FIG. 1, which is the same as the plane defined by the incident beam 2 and reflected beam 6. In FIG. 2, beam 11 misses the projection lens 7 and the light source 1 because it is propagating out of plane.

Note that the reflected beam of light 6 has significant divergence. This is due to diffraction from the small aperture of pixel mirror 4. Note that diffracted beam 10 and diffracted beam 11 also have significant divergence. This is due to diffraction from the small aperture of the pixel mirror surround grating 5. Allowances for this beam divergence must be made in the selection of the periodicity and groove orientation of grating 5 so that the diffracted beams entirely miss the projection lens 7.

Figure 3:
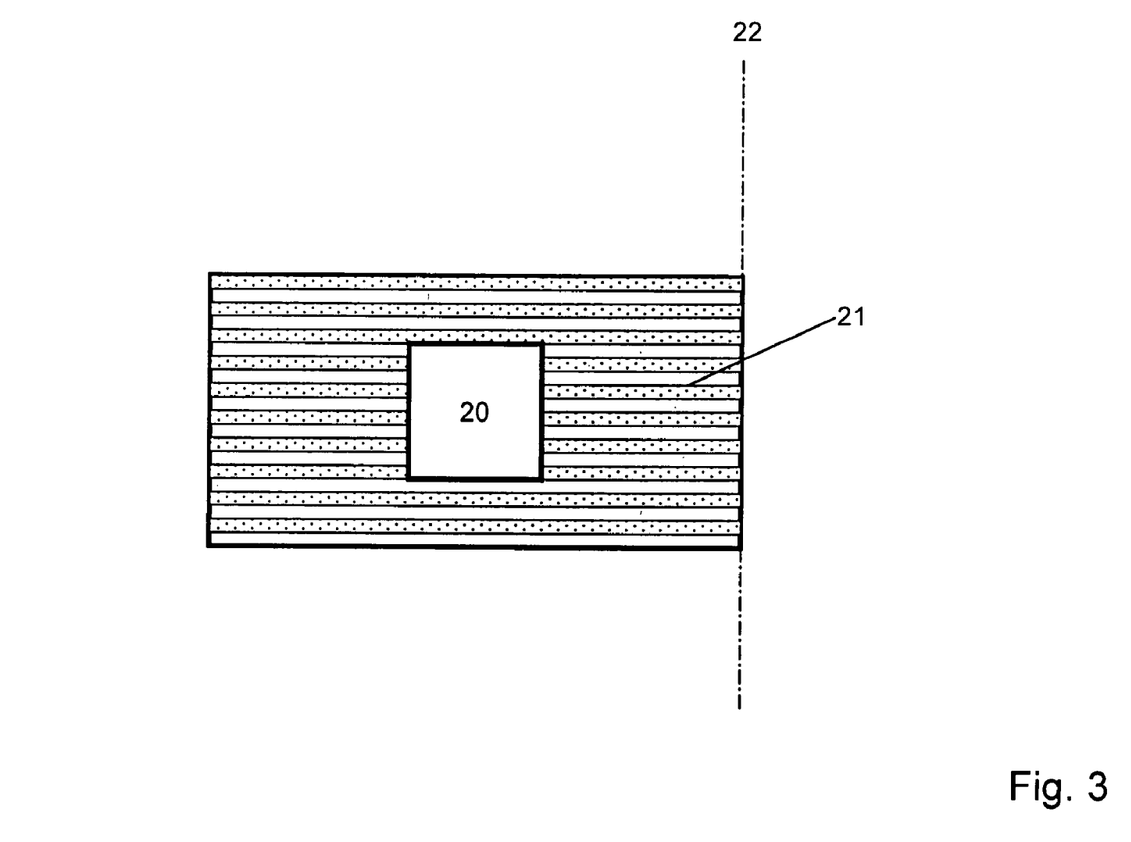
FIG. 3 is a depiction of the preferred embodiment of a DDMD, showing the face of an individual micromirror pixel element with a diffraction grating surround (pixel mirror surround) as a reflection-dissipating region about a central pixel mirror.

FIG. 3 is a conceptual depiction of a diffractive digital micromirror device (DDMD) individual pixel element of a digital micromirror array. The central pixel mirror 20 is nominally 2×2 microns in a 4×8 micron face, approximately ⅛ the area. Mirror 20 is coated to be highly reflecting to the incident light so there is no deleterious absorption or heating in that area of the pixel. The central mirror 20 is surrounded by grating 21 that covers the rest of the surface of the pixel. The grating 21 has a periodic surface relief pattern that is also coated to be highly reflecting to the incident light so there is no deleterious absorption or heating in the grating surround area of the pixel. The light incident on grating 21 is reflected with a periodic phase front distortion that gives rise to the diffracted beams. The entire operation of grating 21 on the incident light is to cause this phase modulation. There is no amplitude modulation of the incident light by grating 21 and grating 21 acts purely as a phase grating.

In the most preferred embodiment, the grating grooves are aligned perpendicular to the axis of rotation 22 of the pixel element, as shown in FIG. 3. In this case the plane defined by the incident beam of light and the 0 order reflected beam of light incident beam of light (not shown in FIG. 3) is parallel to the grating grooves and the diffracted beams of light have propagation directions with maximum angular deviation above and below that plane. In another preferred embodiment, the grating grooves are aligned parallel to the axis of rotation 22 of the pixel element. In this case the plane defined by the incident beam of light and the 0 order reflected beam of light incident beam of light (not shown in FIG. 3) is perpendicular to the grating grooves and the diffracted beams of light have propagation directions that lie within that plane.

Figure 4:
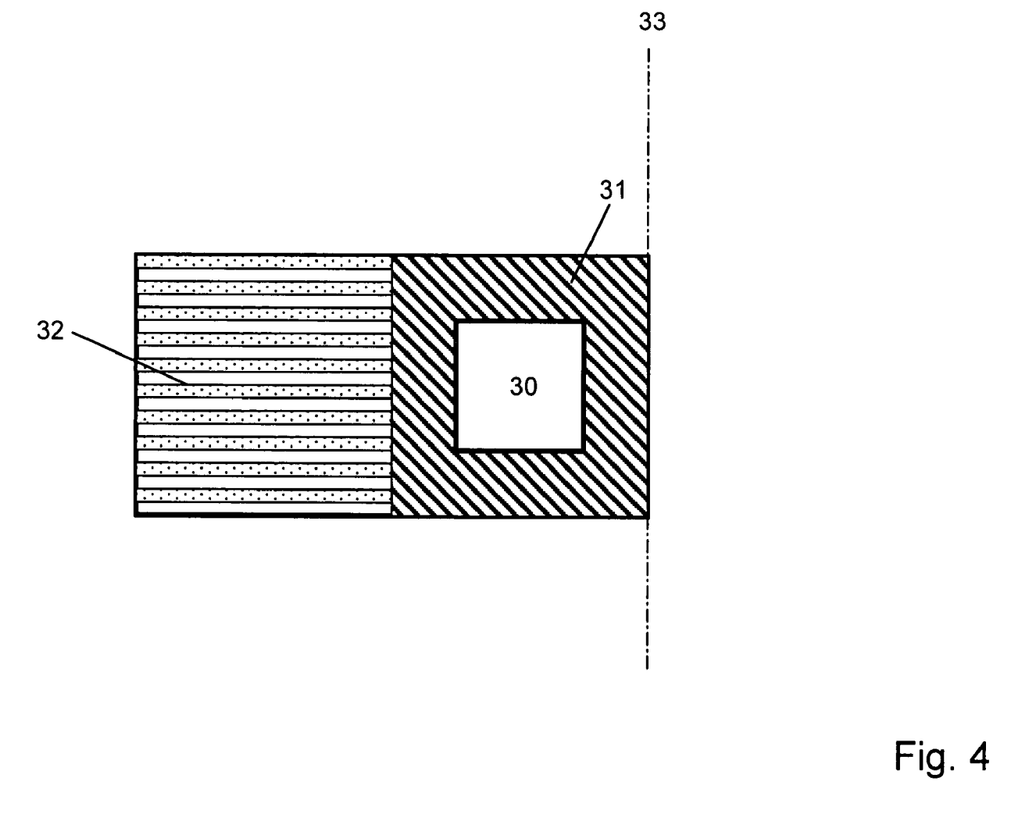
FIG. 4 is a depiction of another preferred embodiment of a DDMD, showing the face of an individual micromirror pixel element with a pixel mirror and a surround having a resolution enhancement feature directly framing the pixel mirror, plus a diffraction grating portion.

FIG. 4 is a conceptual depiction of an improved diffractive digital micromirror device (DDMD) individual pixel element of a digital micromirror array. The pixel mirror 30 is nominally 2×2 microns and the overall pixel face size is 4×8 microns. As in the case of FIG. 3, the mirror 20 is coated to be highly reflecting to the incident light so there is no deleterious absorption or heating in that area of the pixel. Pixel mirror 30 is centered in the right half of the pixel and surrounded by a resolution enhancement feature 31 that covers the remainder of the right half of the pixel. Resolution enhancement feature 31 could be a reflective phase shift feature, for example, that is designed to sharpen the image produced by the light reflected from the pixel and is coated to be highly reflecting to the incident light so there is no deleterious absorption or heating in that area of the pixel.

The left half of the pixel surface is covered by a grating 32 that, as in the case of FIG. 3 has a periodic surface relief pattern that is also coated to be highly reflecting to the incident light so there is no deleterious absorption or heating in the grating surround area of the pixel. The light incident on grating 21 is reflected with a periodic phase front distortion that gives rise to the diffracted beams. The entire operation of grating 21 on the incident light is to cause this phase modulation. There is no amplitude modulation of the incident light by grating 21 and grating 21 acts purely as a phase grating.

In the most preferred embodiment, the grating grooves are aligned perpendicular to the axis of rotation 33 of the pixel element, as shown in FIG. 4. In this case the plane defined by the incident beam of light and the 0 order reflected beam of light incident beam of light (shown in FIG. 4) is parallel to the grating grooves and the diffracted beams of light have propagation directions with maximum angular deviation above and below that plane.

In another preferred embodiment, the grating grooves are aligned parallel to the axis of rotation 33 of the pixel element. In this case the plane defined by the incident beam of light and the 0 order reflected beam of light incident beam of light (not shown in FIG. 4) is perpendicular to the grating grooves and the diffracted beams of light have propagation directions that lie within that plane.

Figure 5:
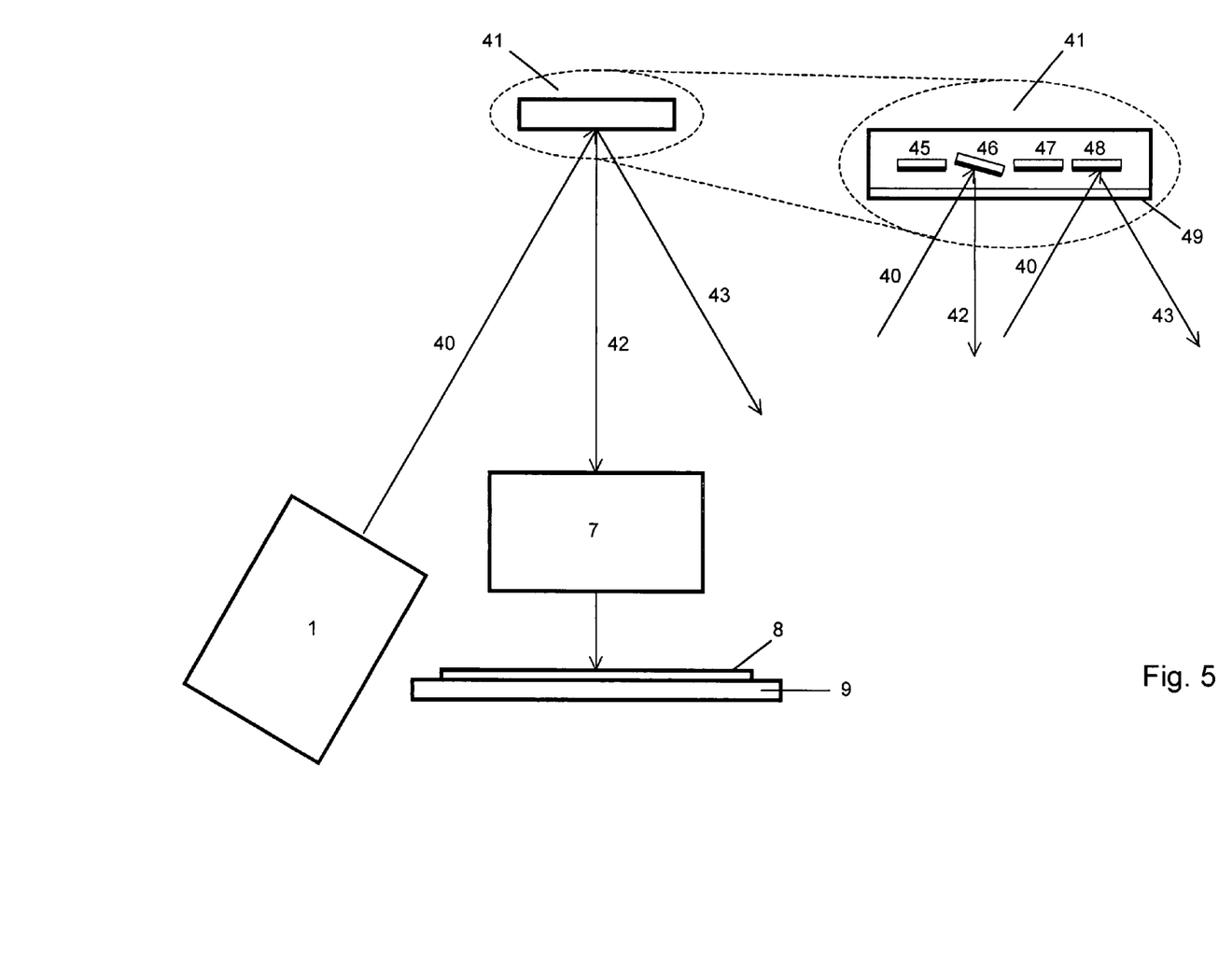
FIG. 5 shows a maskless lithography system that makes use of an SLM composed of DDMDs, showing multiple pixel elements in both "selected" and "non-selected" angular positions.

FIG. 5 shows a maskless lithography system that makes use of an SLM composed of the diffracting digital micromirror devices (DDMD), showing multiple pixel elements. A light source 1, which could be either a laser or a lamp, emits a ray of light 40 that is incident on SLM 41. When the pixel is in the "selected" angular position the reflected ray of light 42 is incident on projection lens 7 for transmission to the substrate 8 for useful work. Substrate 8 is mounted upon stage 9. When the pixel is in the "non-selected" angular position, the reflected ray of light 43 is not incident on projection lens 7 and hence is not transmitted to substrate 8. The expanded insert shows the SLM 41 with several DDMD pixels 45, 46, 47 and 48. A window 49 protects the DDMDs from the external environment. Pixel 46 is shown in the "selected" position and pixels 45, 47, and 48 are shown in the "non-selected" position. For sake of clarity, the diffracted rays shown in FIG. 1 are not shown in FIG. 5.

Figure 6:
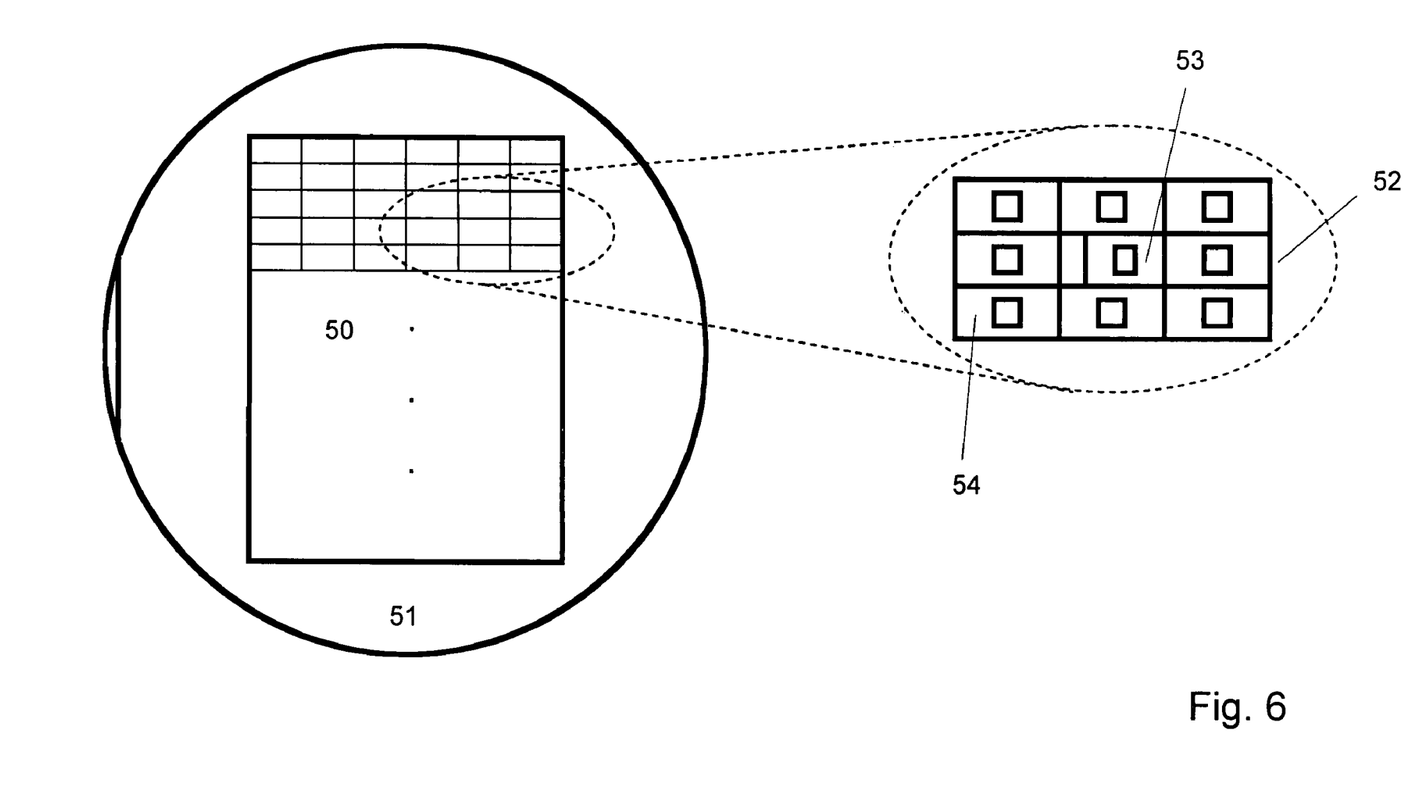
FIG. 6 shows a front view of an SLM array composed of DDMDs, showing multiple pixel elements in both "selected" and "non-selected" angular positions.

FIG. 6 shows a front view of the SLM array composed of the diffracting digital micromirror devices (DDMD). The SLM array 50 is produced on a single silicon wafer 51, using standard microelectronics fabrication technology. The expanded insert shows a region 52 of the array with 9 DDMD pixel elements. The central pixel 53 is shown in the "selected" angular position. The other pixels 54 are shown in the "non-selected" angular position.

Figure 7:
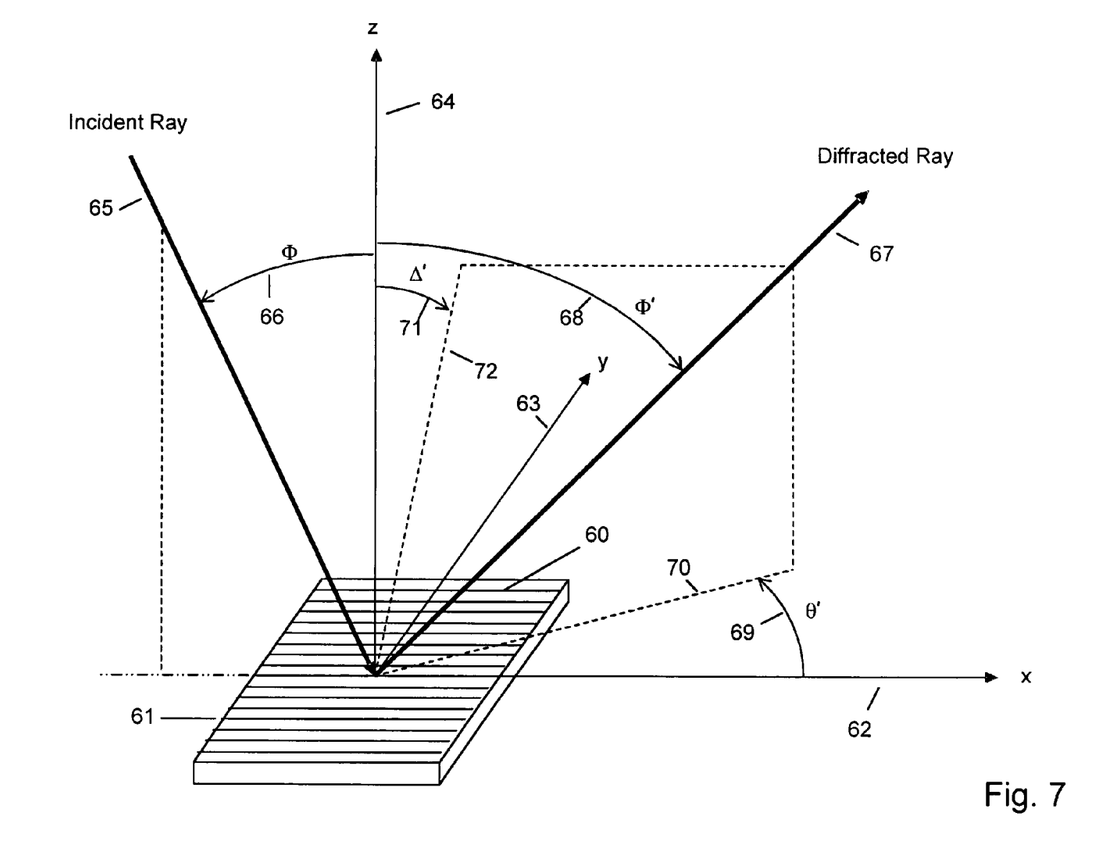
FIG. 7 shows the coordinate system used to define the angular positions of the incident ray and of the diffracted and reflected rays with respect to the DDMD pixel surface plane and grating groove orientation.

FIG. 7 shows the coordinate system used to define the angular positions of the incident ray and of the diffracted and reflected rays with respect to the DDMD pixel surface plane 60 and grating groove 61 orientation. An orthogonal coordinate system is defined with x-axis 62, y-axis 63, and z-axis 64. The x-y plane is parallel and coincident with the DDMD pixel surface plane 60. The orientation of the grating grooves 61 is arbitrary, but in FIG. 7 is shown parallel to the x-axis. The incident ray 65 propagates in the x-z plane at angle of incidence 66 denoted by symbol $\Phi$. The diffracted ray 67 propagates at a compound angle with respect to the coordinate system and its direction is defined by polar angle 68 with respect to the z-axis denoted by symbol $\Phi'$, by the angle 69 with respect to the x-axis of its projection 70 in the x-y plane denoted by the symbol $\theta'$, and by the angle 71 with respect to the z-axis of its projection 72 in the y-z plane denoted by the symbol $\Delta'$.

In this coordinate system, as the grating is rotated by angle $\delta$ (shown in the inset in FIG. 7) about the y-axis, the incident ray remains in the x-z plane, but the angle of incidence changes from $\Phi$ to $\Phi+\delta$. This rotation corresponds to switching from the "selected" state to the "non-selected" state. Hence, the original position of the projection lens for the selected state is centered on the zero order reflected ray. This ray is in the x-z plane at an angle $\Phi'$ with respect to the z-axis. As the grating is rotated by $\delta$ to the off state, the position of the projection lens moves toward the z-axis by an angular amount $\delta$. The projection lens is always bisected by the x-z plane. In the non-selected state, it is vital that the reflected ray and all of the diffracted rays miss the aperture of the projection lens, which has an acceptance half-angle $\epsilon$. In order for the reflected ray to miss the input aperture, it is required that $\delta > \epsilon/2$.

The angle $\Delta'$ takes on particular importance as the grating is rotated, since it provides a measure of the amount by which the diffracted ray is skewed away from the x-z plane. In some cases $\Delta'$ can be large enough that the diffracted ray will avoid the input aperture of the projection lens entirely as the grating is rotated. This requires that $\Delta' > \epsilon$.

For one particular configuration, where the tilting access of the cantilever is parallel to the grating pattern, the grating grooves are parallel to the y-axis. In this configuration, which corresponds to the normal use of gratings in spectroscopy, $\theta'=0$ and $\Delta'=0$ and the diffracted rays are all in the x-z plane. The relationship between $\Phi$ and $\Phi'$ is given by the well known diffraction grating formula $$\sin \Phi' - \sin \Phi = n\lambda/\Lambda \quad \text{(Equation 1)}$$

where $n=0, +/-1, +/-2, \ldots$ is the order of diffraction with $n=0$ corresponding to specular reflection; $\lambda$ is the wavelength of the optical radiation; and $\Lambda$ is the grating period. (See for instance R. A. Sawyer, *Experimental Spectroscopy*, Dover (1963), pg 129.) Clearly this configuration is not desirable for the application of this invention, since the diffracted rays are in the same plane as the projection lens. As the grating is rotated by angle $\delta$, diffracted rays are likely to enter the input aperture of the projection lens unless the angular spread between the diffracted orders is larger than $2\delta + 2\epsilon$.

For the more desirable configuration, where the tilting axis of the cantilever is perpendicular to the grating pattern, the geometry is exactly as shown in FIG. 7, with the grooves parallel to the x-axis. In this case, it can be shown that the relationship between $\Phi$ and $\Phi'$ is given by $$\sin^2 \Phi' - \sin^2 \Phi = (n\lambda/79)^2. \quad \text{(Equation 2)}$$

The angles $\theta'$ and $\Delta'$, that measure the deviation of the diffracted ray propagation direction from the z-x plane of incidence, are given by $$\tan \theta' = n\lambda/\Lambda \sin \Phi \quad \text{(Equation 3)}$$

and $$\tan \Delta' = n\lambda/\Lambda \cos \Phi'. \quad \text{(Equation 4)}$$

It is instructive to study two limiting cases for these results. Note that for the case of $n=0$, $\theta'=0$ and $\Delta'=0$ for all values of $\Phi$ and there is no deviation from the plane of incidence. This is as would be expected for specular reflection. Also note that for the case of normal incidence where $\Phi=0$, Equation 2 reduces to $\sin \Phi'=n\lambda/\Lambda$ and Equation 3 gives $\theta'=0$. In this case, all of the diffracted rays are in the z-y plane, $\Delta'=\Phi'$ and Equation 4 also reduces to $\sin. \Phi'=n\lambda/\Lambda$. Hence, as expected, the diffraction angles are the same as predicted by the standard diffraction grating theory as expressed in Equation 1.

As a practical example, consider the case of a grating with grooves parallel to the x-axis that is tilted by $\delta=20$ degrees. Assuming a projection lens with an acceptance half angle of $\epsilon=10$ degrees, a good choice for the "selected" angle of incidence is $\Phi=20$ degrees. Then the "non-selected" angle of incidence will be 40 degrees. Table 1 below shows the calculated values for $\Phi'$, $\theta'$, and $\Delta'$ for $n=0$ and $n=1$ for a range of angles of incidence between 20 and 40 degrees and for several different grating frequencies. Paying particular attention to the parameter Δ', it can be seen that a grating frequency of λ/Λ=0.2 or greater is sufficient to satisfy the condition Δ'>ε that insures the diffracted beams miss the projection lens for all values of Φ between 20 and 40 degrees.

TABLE 1

Diffraction Angles for Grooves Parallel to X-Axis

| Φ  | n | λ/Λ    | Φ'      | Θ'      | Δ'      |
|----|---|--------|---------|---------|---------|
| 20 | 0 | 0.3000 | 20.0000 | 0.0000  | 0.0000  |
| 25 | 0 | 0.3000 | 25.0000 | 0.0000  | 0.0000  |
| 30 | 0 | 0.3000 | 30.0000 | 0.0000  | 0.0000  |
| 35 | 0 | 0.3000 | 35.0000 | 0.0000  | 0.0000  |
| 40 | 0 | 0.3000 | 40.0000 | 0.0000  | 0.0000  |
| 20 | 1 | 0.1000 | 20.8756 | 16.2979 | 6.1089  |
| 25 | 1 | 0.1000 | 25.7400 | 13.3125 | 6.3348  |
| 30 | 1 | 0.1000 | 30.6573 | 11.3099 | 6.6307  |
| 35 | 1 | 0.1000 | 35.6074 | 9.8898  | 7.0120  |
| 40 | 1 | 0.1000 | 40.5808 | 8.8428  | 7.5008  |
| 20 | 1 | 0.2000 | 23.3411 | 30.3174 | 12.2886 |
| 25 | 1 | 0.2000 | 27.8756 | 25.3254 | 12.7487 |
| 30 | 1 | 0.2000 | 32.5827 | 21.8014 | 13.3524 |
| 35 | 1 | 0.2000 | 37.4050 | 19.2231 | 14.1319 |
| 40 | 1 | 0.2000 | 42.3132 | 17.2833 | 15.1342 |
| 20 | 1 | 0.3000 | 27.0616 | 41.2553 | 18.6178 |
| 25 | 1 | 0.3000 | 31.2164 | 35.3694 | 19.3303 |
| 30 | 1 | 0.3000 | 35.6685 | 30.9638 | 20.2679 |
| 35 | 1 | 0.3000 | 40.3379 | 27.6111 | 21.4834 |
| 40 | 1 | 0.3000 | 45.1820 | 25.0193 | 23.0555 |

Figure 8:
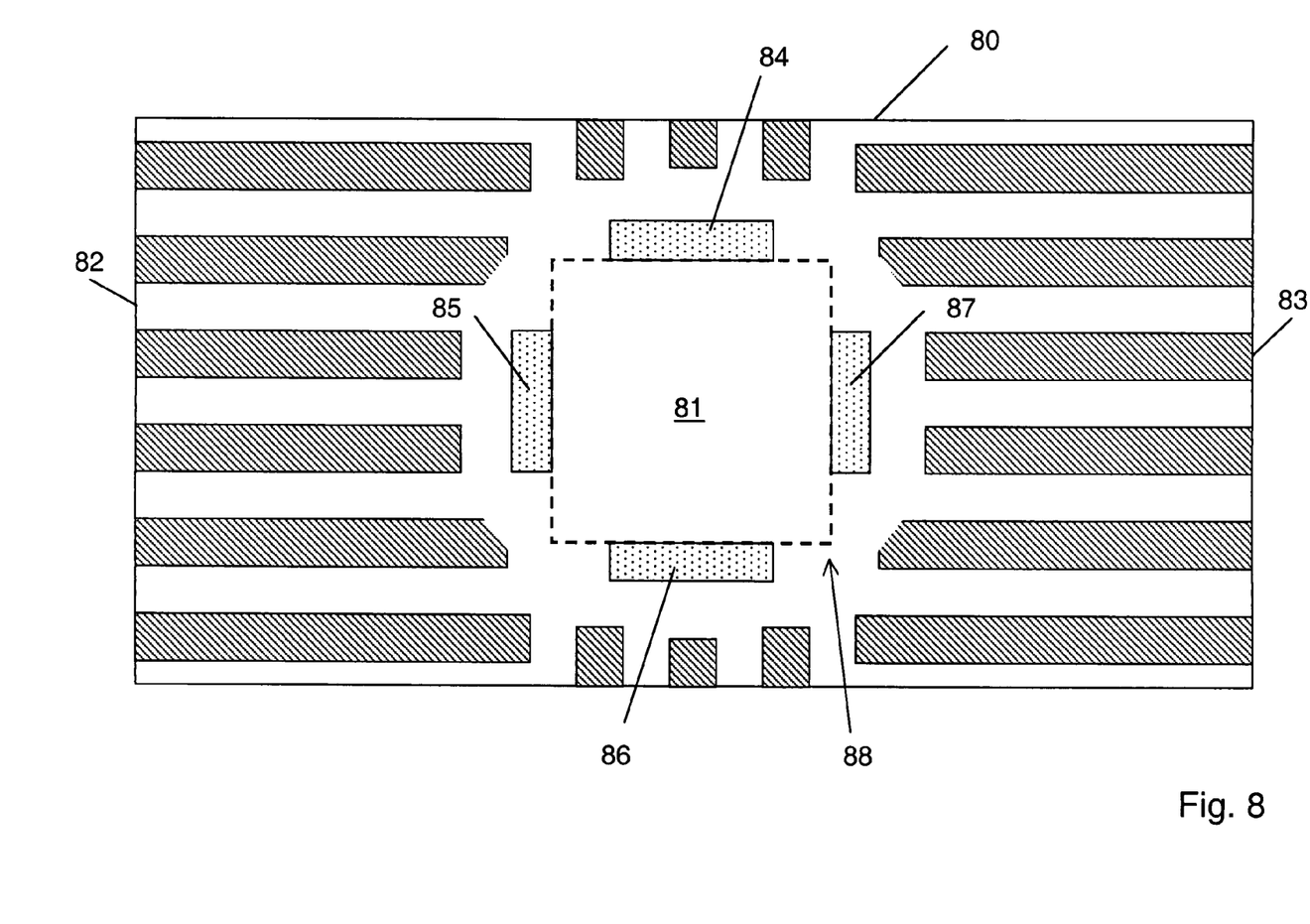
FIG. 8 illustrates a spatial light modulator pixel element having a reflective patch, heat-rejecting diffraction grating regions, and resolution enhancement features.

FIG. 8 shows a pixel element 80 of the enhanced spatial light modulator (ESLM) having both heat-rejecting diffraction gratings and resolution enhancement features. The overall size of the pixel element 80 may be, for example, 4×8 μm. The reflective patch is shown as 81 and its typical size may be 2×2 μm. The reflective patch is fabricated by selectively metallizing the appropriate region of the pixel element using conventional semiconductor device fabrication processes. The heat-rejecting diffraction grating regions are shown as 82 and 83. As described before, these regions may be fabricated in a variety of ways. A detailed fabrication method for the diffraction gratings is described below. The pixel element also comprises resolution enhancement features 84–87, which provide phase reversal of the rays reflected from them in relation to the light rays reflected from the reflective element 81. These resolution enhancement regions may be made by, for example, surface-relief features or dielectric coatings. Additional resolution enhancement techniques include providing a serif 88 at each corner of the reflective patch. Note that the configurations described above for the diffraction gratings and resolution enhancement features are just some of the many ways of adding such characteristics around a reflective sub-pixel region; numerous variations may be devised by others skilled in the art.

Fabrication Method—Diffraction Grating

Figure 9:
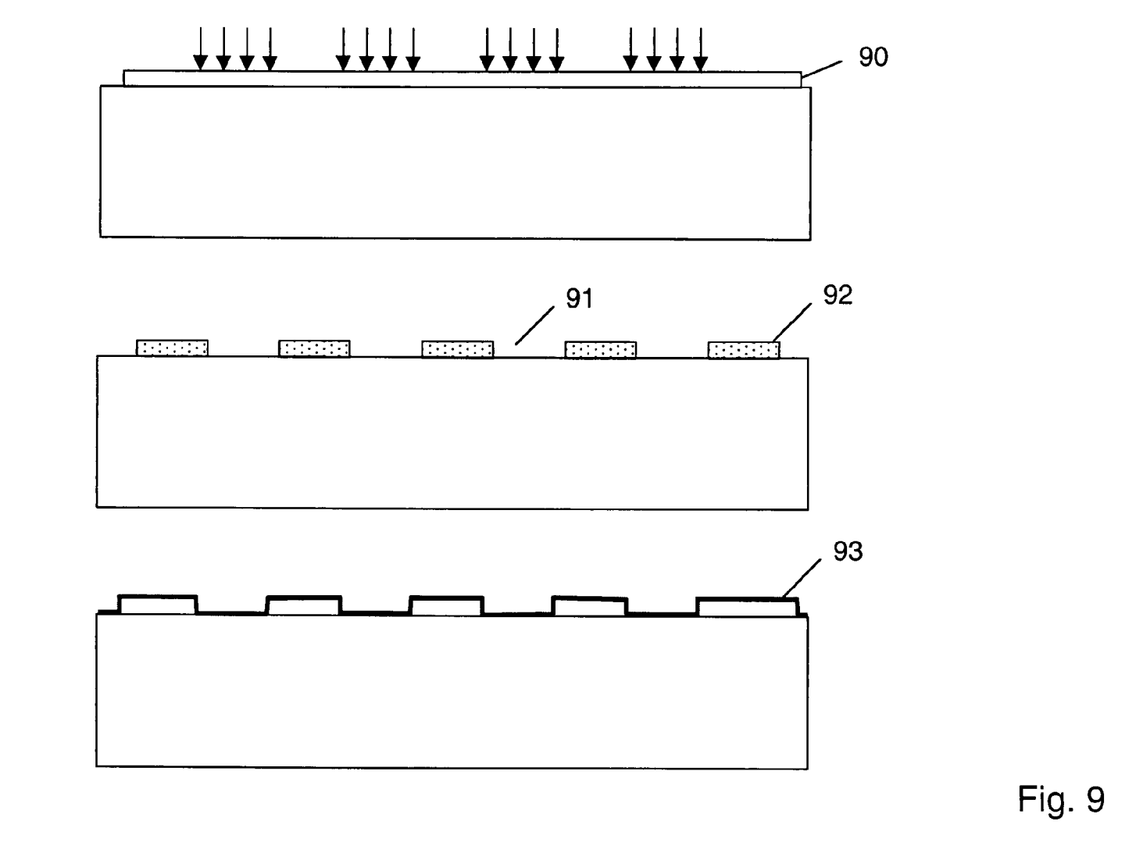
FIG. 9 shows the process steps for fabricating the diffraction grating regions.

The diffraction grating for elimination of heat build-up can be fabricated by the following method, as illustrated in FIG. 9:

Step 1: Deposit a photoresist layer 90 on the pixel element surface. The resist may be deposited by spinning, for example. The thickness of the resist layer should be equal to one-fourth of the wavelength of the light source used for illumination of the pixel.

Step 2: Pattern the resist using conventional lithographic processes and produce line-space patterns 91, 92 of the desired dimensions (determined as described in the Detailed Description.)

Step 3: Deposit a high-reflectivity layer on top of the patterned photoresist and on the cleared pixel areas. The high-reflectivity layer may be, for example, a metallic coating (e.g., aluminum) with an overcoat of magnesium fluoride, or a multilayer dielectric coating (e.g., using layers of various oxides, such as oxides of magnesium, hafnium, ruthenium, scandium, titanium, etc.)

Fabrication Method—Resolution Enhancement Features

Figure 10:
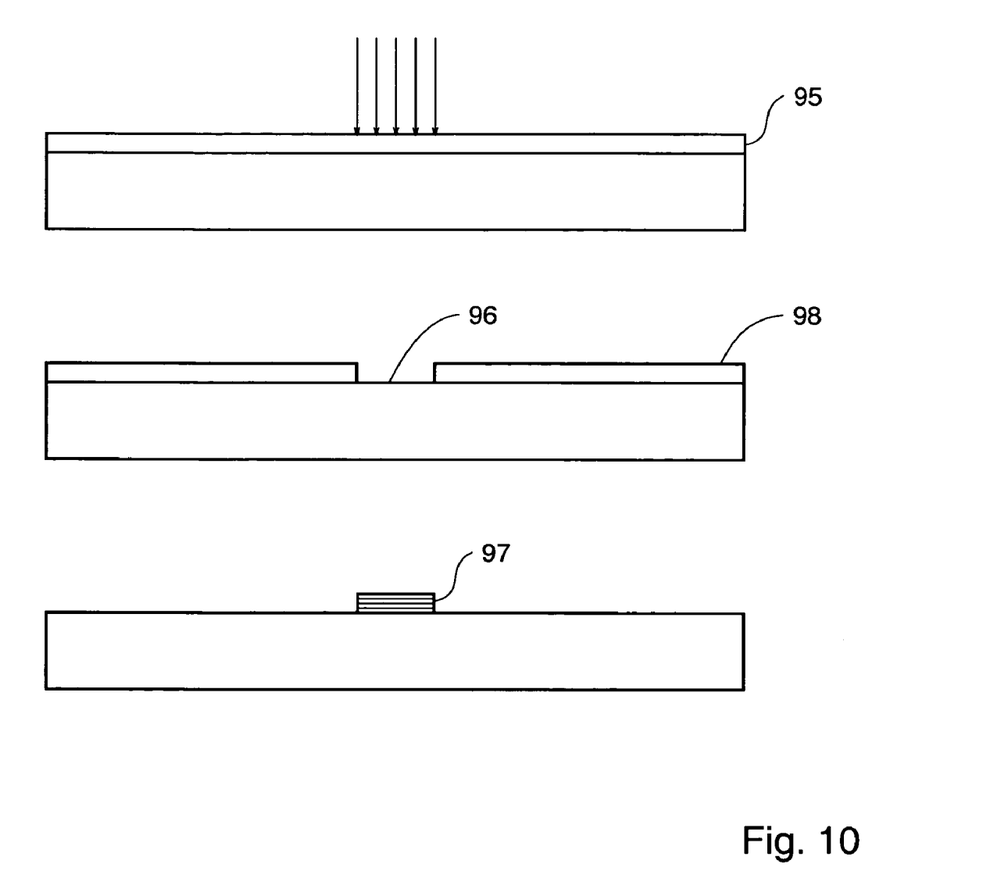
FIG. 10 shows the process steps for fabricating the resolution enhancement features.

The resolution enhancement features are regions of phase reversal placed adjacent to the reflective patch of the pixel element. Their typical configuration may be rectangular bars whose length is slightly less than the length of a side of the reflective patch and whose width is a fraction of the length. In prior art, such features have been widely used in numerous configurations in the application of mask-based lithography. Therefore, there exist a variety of well-known processes to fabricate such features. Accordingly, for the present invention, a typical fabrication method for providing resolution enhancement features in the spatial light modulator may have the following process steps, as illustrated in FIG. 10:

Step 1: Deposit a layer of a suitable photoresist 95 on the pixel element surface by a conventional process such as spinning. The resist thickness and its processing conditions are selected s recommended by the resist manufacturer.

Step 2: Pattern the resist using a mask designed for the appropriate configuration of the resolution enhancement feature. The resist patterning step includes exposure and development of resist, which results in the required region 96 being opened up in the vicinity of the reflective patch.

Step 3: Deposit a coating 97 of a suitable phase-reversal material in the open region. Such a coating may be, for example, a multilayer stack of a variety of oxide materials whose thicknesses are selected for maximum reflectivity of the composite structure at the wavelength of illumination. These oxides may be one or more of magnesium oxide, hafnium oxide, scandium oxide, ruthenium oxide and titanium oxide.

Step 4: Remove the photoresist remaining 98 on the pixel element by a chemical stripping process.

As previously remarked, the methods of fabrication of the grating structures and resolution enhancement features are varied and well known; above we have provided only two examples. Many other process sequences will be familiar to those even cursorily skilled in the art.

The invention has been shown and described configured as a first embodiment and second embodiment. Certain variations have been shown without departing from the spirit and scope of the invention, as defined by the following claims:

The invention claimed is:

1. An enhanced spatial light modulator (SLM) array of a multitude of selectable pixel elements, each having physically-definable selected and non-selected modes, each pixel element comprising:
   a) an active region having a characteristic physical condition, which, when the pixel is in selected mode, serves to redirect the radiation incident on it to a primary image position which is located to be effective in a primary use; and
   b) a passive region having a different characteristic physical condition, which, when the pixel is in selected mode, serves as means to redirect the radiation incident on it to a location other than said primary image position.

2. The enhanced spatial light modulator array according to claim 1, wherein for a selected pixel element in selected mode, said active region is reflective along a primary axis; and said passive region for said selected pixel element in selected mode redirects said incident radiation in a secondary direction differing in alignment substantially from said primary axis.

3. The enhanced spatial light modulator array according to claim 2, wherein for each selected pixel element of said SLM array, the active region is small as contrasted to the passive region, and is reflective; and said passive region is diffractive, and diffracts a substantial portion of said incident radiation in said secondary direction.

4. The enhanced spatial light modulator array according to claim 1, each pixel element further comprising:
  c) an enhancement region, located proximate to said active region, having a physical characteristic which serves to alter the optical characteristics of the radiation redirected from said active region when in selected mode.

5. The enhanced spatial light modulator array according to claim 1, wherein for each pixel element of said SLM array,
  the active region is small as contrasted to the passive region, and is reflective; and
  said passive region is a diffraction grating, and diffracts a substantial portion of said incident radiation in said secondary direction.

6. The enhanced spatial light modulator array according to claim 5, wherein for each pixel element of said SLM array,
  said passive region is a diffraction grating of the blazed type.

7. The enhanced spatial light modulator array according to claim 5, wherein for each pixel element of said SLM array,
  said passive region is a diffraction grating of the surface relief type.

8. The enhanced spatial light modulator array according to claim 5, wherein for each pixel element of said SLM array,
  said passive region is a diffraction grating of constant pitch.

9. The enhanced spatial light modulator array according to claim 5, wherein for each pixel element of said SLM array,
  said passive region is a diffraction grating of variable pitch.

10. The enhanced spatial light modulator array according to claim 5, wherein for each pixel element of said SLM array,
  said means to redirect the incident radiation to other than said primary image position is a diffraction grating with grooves so aligned that the plane of diffracted rays is parallel to the plane of reflection from said active region.

11. The enhanced spatial light modulator array according to claim 5, wherein for each pixel element of said SLM array,
  said means to redirect the incident radiation to other than said primary image position is a diffraction grating with grooves so aligned that the plane of diffracted rays is orthogonal to the plane of reflection from said active region.

12. The enhanced spatial light modulator array according to claim 5, wherein for each pixel element of said SLM array,
  said means to redirect the incident radiation to other than said primary image position is a diffraction grating with grooves so aligned that the plane of diffracted rays is different from the plane of reflection from said active region.

13. The enhanced spatial light modulator array according to claim 5, wherein:
  said means to redirect the radiation incident on the passive region to a location other than said primary image position is a diffraction grating with grooves positioned with grating lines in different directions in differing regions.

14. The enhanced spatial light modulator array according to claim 5, wherein:
  said means to redirect the radiation incident on the passive region to a location other than said primary image position is a diffraction grating with grooves so aligned that the plane of some diffracted rays is orthogonal to the plane of reflection from said active region, and with other grooves so aligned that the plane of some diffracted rays is parallel to the plane of reflection from said active region.

15. The enhanced spatial light modulator array of a multitude of selectable pixel elements, each having physically-definable selected and non-selected modes, according to claim 5, wherein:
  said means to redirect the radiation incident on the passive region to a location other than said primary image position is a diffraction grating with grooves positioned for a duty cycle approximating 50%.

16. The enhanced spatial light modulator array according to claim 5, wherein:
  said means to redirect the radiation incident on the passive region to a location other than said primary image position is a phase shift means so aligned as to, provide a 180 degree phase shift relative to reflected light from said active region.

17. The enhanced spatial light modulator array according to claim 1, wherein:
  said SLM array is a micromirror device.

18. The enhanced spatial light modulator array according to claim 1, wherein:
  said SLM array is a liquid crystal light modulator device.

19. The enhanced spatial light modulator array according to claim 1, wherein:
  said SLM array is a grating light valve device.

20. The enhanced spatial light modulator array according to claim 5, wherein:
  said SLM array operates by positionally-selected reflectivity.

21. The enhanced spatial light modulator array according to claim 5, wherein:
  said SLM array operates by physically-selected reflectivity.

* * * * *